US012677511B2

(12) United States Patent
Li et al.

(10) Patent No.: US 12,677,511 B2
(45) Date of Patent: Jul. 7, 2026

(54) MANUFACTURING METHOD OF SPLICING DISPLAY PANEL AND SPLICING DISPLAY PANEL

(71) Applicant: TCL CHINA STAR OPTOELECTRONICS TECHNOLOGY CO., LTD., Shenzhen (CN)

(72) Inventors: Linshuang Li, Shenzhen (CN); Kaijun Wang, Shenzhen (CN); Chunge Yuan, Shenzhen (CN); Lixuan Chen, Shenzhen (CN); Mingzhou Wu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 845 days.

(21) Appl. No.: 17/758,976

(22) PCT Filed: Jun. 30, 2022

(86) PCT No.: PCT/CN2022/103076
§ 371 (c)(1),
(2) Date: Jul. 17, 2022

(87) PCT Pub. No.: WO2023/201895
PCT Pub. Date: Oct. 26, 2023

(65) Prior Publication Data
US 2024/0194838 A1     Jun. 13, 2024

(30) Foreign Application Priority Data
Apr. 19, 2022   (CN) .......................... 202210412080.6

(51) Int. Cl.
H10H 20/853        (2025.01)
H10H 20/01         (2025.01)
H10W 90/00         (2026.01)

(52) U.S. Cl.
CPC .......... *H10H 20/853* (2025.01); *H10W 90/00* (2026.01); *H10H 20/0362* (2025.01)

(58) Field of Classification Search
CPC ... H10H 20/853; H10H 20/01; H01L 25/0753
See application file for complete search history.

(56) References Cited

U.S. PATENT DOCUMENTS

2002/0008809 A1*   1/2002  Babuka ................. G09F 9/3026
                                                 349/73
2011/0234967 A1*   9/2011  Kim ...................... G02F 1/1339
                                                 349/190
(Continued)

FOREIGN PATENT DOCUMENTS

CN         109215520 A     1/2019
CN         109545998 A     3/2019
(Continued)

OTHER PUBLICATIONS

International Search Report in International application No. PCT/CN2022/103076, mailed on Dec. 16, 2022.
(Continued)

*Primary Examiner* — Moazzam Hossain
(74) *Attorney, Agent, or Firm* — PV IP PC; Christopher S. Ruprecht; Wei Te Chung

(57) ABSTRACT

A manufacturing method of a splicing display panel and the splicing display panel are provided. Front surfaces of backplates are encapsulated to form first encapsulation layers. Then, at least two backplates are fixed on a transparent substrate to make grooves be formed between lateral surfaces of two adjacent backplates and the transparent substrate. Next, second encapsulation layers are formed in the
(Continued)

grooves to obtain an encapsulation semi-finished product. Finally, a third encapsulation layer is formed on a peripheral side of the encapsulation semi-finished product, thereby obtaining the splicing display panel. Technical problems that encapsulation of lateral surfaces of the display panel is difficult and seams of the splicing display panel are obvious can be solved.

9 Claims, 6 Drawing Sheets

(56) References Cited

U.S. PATENT DOCUMENTS

| | | | | | |
|---|---|---|---|---|---|
| 2020/0111771 | A1* | 4/2020 | Su | | H01L 25/167 |
| 2021/0384463 | A1* | 12/2021 | Guo | | H10K 50/844 |
| 2022/0052022 | A1* | 2/2022 | Yu | | H01L 24/33 |
| 2023/0282650 | A1* | 9/2023 | Jang | | H10D 86/0231 |
| 2024/0021657 | A1* | 1/2024 | Jung | | H10H 29/142 |
| 2024/0332465 | A1* | 10/2024 | Li | | H10H 20/854 |

FOREIGN PATENT DOCUMENTS

| | | | | | |
|---|---|---|---|---|---|
| CN | 111028697 | A | 4/2020 | | |
| CN | 113178139 | A | 7/2021 | | |
| CN | 114038340 | A | 2/2022 | | |
| CN | 114188467 | A | 3/2022 | | |
| CN | 113178139 | B | * | 8/2023 | G09F 9/33 |
| WO | 0201284 | A1 | 1/2002 | | |
| WO | 2010106637 | A1 | 9/2010 | | |

OTHER PUBLICATIONS

Written Opinion of the International Search Authority in International application No. PCT/CN2022/103076, mailed on Dec. 16, 2022.

Chinese Office Action issued in corresponding Chinese Patent Application No. 202210412080.6 dated Dec. 5, 2022, pp. 1-9.

* cited by examiner

MANUFACTURING METHOD OF SPLICING DISPLAY PANEL AND SPLICING DISPLAY PANEL

BACKGROUND OF INVENTION

Field of Invention

The present application relates to the field of display, and particularly to a manufacturing method of a splicing display panel and the splicing display panel.

Description of Prior Art

Compared to display technologies of organic light-emitting diode (OLED) displays and liquid crystal displays (LCDs) in traditional approach, display technologies of mini light-emitting diodes (mini-LEDs) or micro light-emitting diodes (micro-LEDs) have lower power consumption, faster response time, higher image resolution, and higher color gamut.

However, due to limitation of sizes of mini-LED or micro-LED display panels, current large-sized mini-LED or micro-LED display devices are mainly formed by splicing a plurality of display panels.

In the prior art, after display devices are manufactured, they need to pass reliability (RA) tests. In order to improve reliability of the mini-LED or micro-LED display devices, four lateral surfaces of the mini-LED or micro-LED display panels need to be encapsulated, which is mainly realized by coating lateral surfaces of substrates currently. In procedures of research and practice of the prior art, the inventor of the present application found that the main defects are as below.

1. Side coating on the sides has high requirements on viscosity of side sealant. When the viscosity is weak, adhesive will flow to front sides, a plurality of side coating and a plurality of curing are required, and thick encapsulation layers are difficult to be obtained; and when the viscosity is high, after the side coating, bubbles of the adhesive are obvious, resulting in a high water vapor transmission rate (WVTR), and the water blocking performance is reduced.

2. After the side coating, the side sealant has obvious bubbles, and a bulk density is reduced, leading to a higher thickness to meet the requirements of RA, Furthermore, bezels are significantly increased, resulting in obvious seams.

SUMMARY OF INVENTION

Embodiments of the present application provides a manufacturing method of a splicing display panel and the splicing display panel, which can solve technical problems that encapsulation of lateral surfaces of the display panel is difficult and seams of the splicing display panel are obvious.

One embodiment of the present application provides a manufacturing method of a splicing display panel, which includes:

step B1: providing at least two backplates, wherein light-emitting devices are disposed on surfaces of the at least two backplates;

step B2: forming first encapsulation layers on the at least two backplates, wherein the first encapsulation layers cover the light-emitting devices;

step B3: disposing the at two backplates on a transparent substrate, wherein the first encapsulation layers are disposed between the at least two backplates and the transparent substrate, and lateral surfaces of two adjacent backplates and the transparent substrate enclose to form grooves;

step B4: forming second encapsulation layers in the grooves to obtain an encapsulation semi-finished product; and step B5: forming a third encapsulation layer on peripheral sides of the encapsulation semi-finished product.

Optionally, in some embodiments of the present application, in the step B3, the at least two backplates are distributed in an array manner, and a width of the grooves ranges from 40 μm to 1000 μm.

Optionally, in some embodiments of the present application, after forming the first encapsulation layers on the at least two backplates, the step B2 further includes: performing a cutting process on the at least two backplates to remove process edges of the at least two backplates.

Optionally, in some embodiments of the present application, in the step B1, the at least two backplates are rectangular;

in the step B3, the width of the grooves between a long edge of one of the at least two backplates and a long edge of adjacent one of the at least two backplates ranges from 40 μm to 700 μm, and the width of the grooves between a short edge of one of the at least two backplates and a short edge of adjacent one of the at least two backplates ranges from 40 μm to 1000 μm.

Optionally, in some embodiments of the present application, in the step B3, the transparent substrate includes a first region and a second region, the first region is configured to enclose the second region, and the at least two backplates and the grooves are disposed corresponding to the second region;

in the step B5, the third encapsulation layer is disposed corresponding to the first region.

Optionally, in some embodiments of the present application, a width of the first region ranges from 0.2 mm to 1 mm.

Optionally, in some embodiments of the present application, a light transmittance rate of the first encapsulation layers is greater than a light transmittance rate of the third encapsulation layer, and a light transmittance rate of the second encapsulation layers is greater than the light transmittance rate of the third encapsulation layer.

Optionally, in some embodiments of the present application, in the step B2, a thickness of the first encapsulation layers is 1.2 to 2 times of a thickness of the light-emitting devices.

Optionally, in some embodiments of the present application, in the step B1, the backplates are rectangular, and a bonding portion is disposed on a short edge of the at least two backplates; and the step B2 further includes bonding a chip-on-film thin film to the bonding portion of the backplates.

Optionally, in some embodiments of the present application, in the step B4, an adhesive is filled into the grooves, a material of the adhesive is selected from one or two of epoxy resin or acrylic resin; and then, a cure process is performed on the adhesive, thereby obtaining the second encapsulation layers.

One embodiment of the present application further provides a splicing display panel, including:

a transparent substrate;

at least two backplates disposed on a side of the transparent substrate, wherein light-emitting devices are disposed on surfaces of the at least two backplates close to the transparent substrate, lateral surfaces of two adjacent backplates and the transparent substrate enclose to form grooves;

first encapsulation layers disposed between the transparent substrate and the at least two backplates, wherein the first encapsulation layers cover the light-emitting devices;

second encapsulation layers disposed in the grooves; and a third encapsulation layer disposed on peripheral sides of the at least two backplates.

Optionally, in some embodiments of the present application, the at least two backplates are rectangular, a width of the second encapsulation layers between a long edge of one of the at least two backplates and a long edge of adjacent one of the at least two backplates ranges from 40 μm to 700 μm.

Optionally, in some embodiments of the present application, the backplates are rectangular, a width of the second encapsulation layers between a short edge of one of the at least two backplates and a short edge of adjacent one of the at least two backplates ranges from 40 μm to 1000 μm.

Optionally, in some embodiments of the present application, a light transmittance rate of the first encapsulation layers is greater than a light transmittance rate of the third encapsulation layer, and a light transmittance rate of the second encapsulation layer is greater than the light transmittance rate of the third encapsulation layer.

Optionally, in some embodiments of the present application, a thickness of the first encapsulation layers is 1.2 to 2 times of a thickness of the light-emitting devices.

Optionally, in some embodiments of the present application, the backplates are rectangular, a bonding portion is disposed on a short edge of the at least two backplates, the display panel further includes a chip-on-film thin film, and the chip-on-film thin film is bonded the bonding portion.

Optionally, in some embodiments of the present application, a material of the second encapsulation layers is selected from one or two of epoxy resin or acrylic resin.

Optionally, in some embodiments of the present application, a water vapor transmission rate of the second encapsulation layers is less than or equal to $10^{-3}$ g/m$^2$/day.

Optionally, in some embodiments of the present application, the transparent substrate comprises a first region and a second region, the first region is configured to enclose the second region, the at least two backplates and the grooves are disposed corresponding to the second region, and the third encapsulation layer is disposed corresponding to the first region.

Optionally, in some embodiments of the present application, a width of the third encapsulation layer ranges from 2 mm to 1 mm.

The manufacturing method of the splicing display panel and the splicing display panel are adopted in the embodiments of the present application. Front surfaces of backplates are encapsulated to form first encapsulation layers. Then, at least two backplates on are fixed a transparent substrate to make grooves be formed between lateral surfaces of two adjacent backplates and the transparent substrate. Next, second encapsulation layers are formed in the grooves to obtain an encapsulation semi-finished product. Finally, a third encapsulation layer is formed on the peripheral side of the encapsulation semi-finished product, thereby obtaining the splicing display panel. Beneficial effects of the embodiments of the present application are as below.

1. The second encapsulation layer can be formed by filling the grooves with adhesive, which is simple to operate and is easy to implement. Furthermore, requirement on viscosity of the adhesive is low, and air bubbles are not easily generated. The second encapsulation layer is formed at one time, so there is no problem of low bulk density. A water blocking performance of the second encapsulation layer is good, which can improve product reliability.

2. By adjusting the width of the grooves, the second encapsulation layer of any width can be obtained, which is beneficial to reduce the seams of the splicing display panel.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

Figure 1:
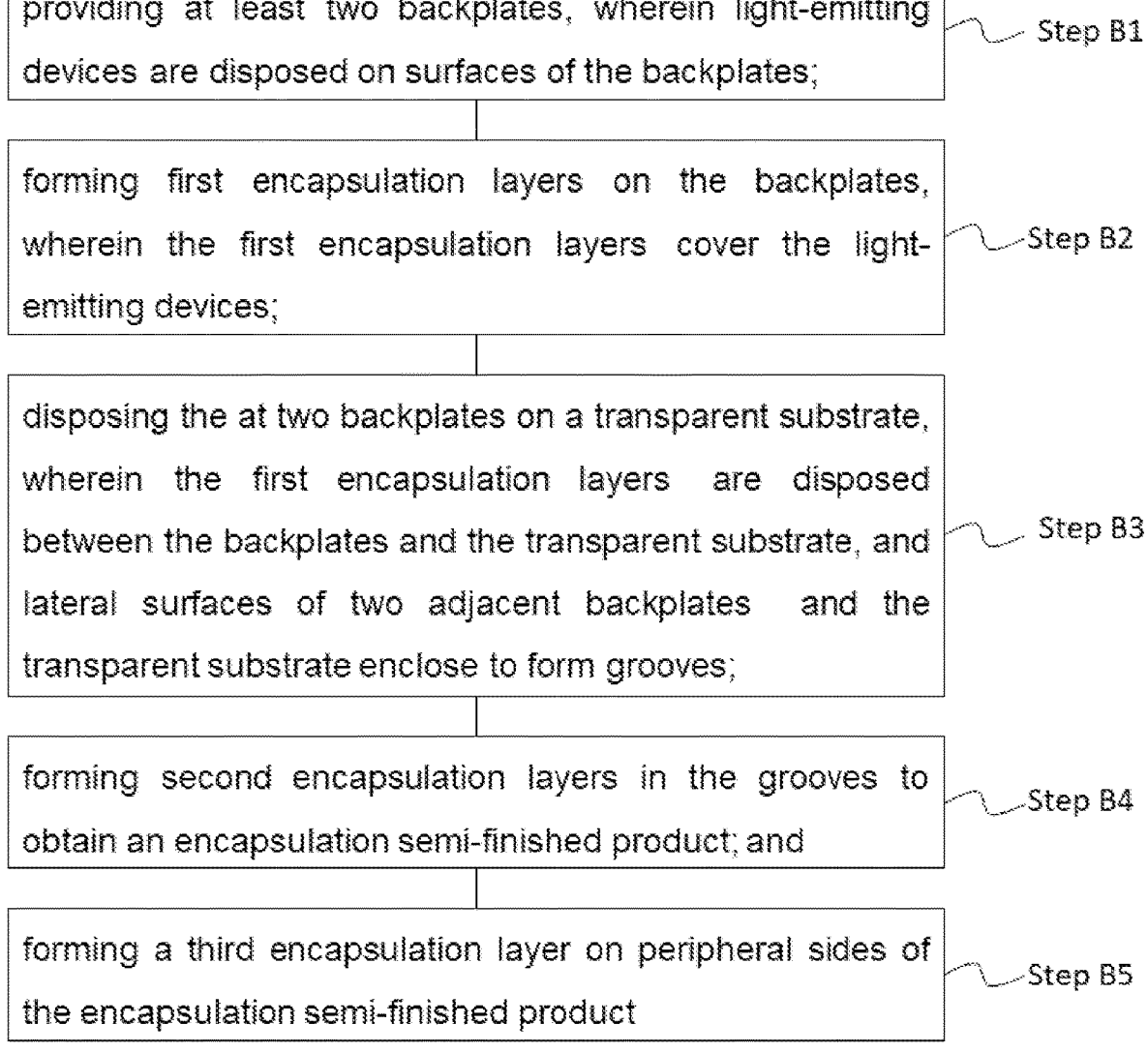
FIG. 1 is a flowchart of a manufacturing method of a splicing display panel provided by one embodiment of the present application.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application.

In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a manufacturing method of a splicing display panel and the splicing display panel. The details are described below respectively. It should be noted that a description order of the following embodiments is not intended to limit a preferred order of the embodiments.

Figure 2:
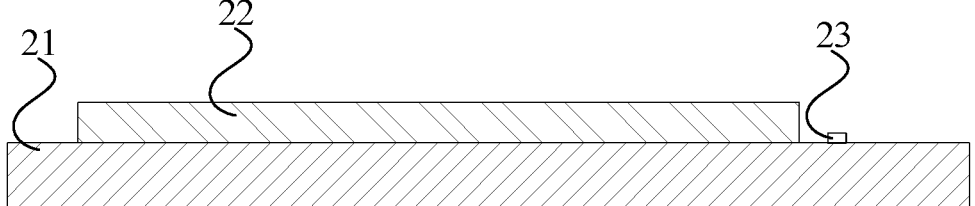
FIG. 2 is a schematic diagram of a sectional structure of forming first encapsulation layers on backplates provided by one embodiment of the present application.
Figure 2:
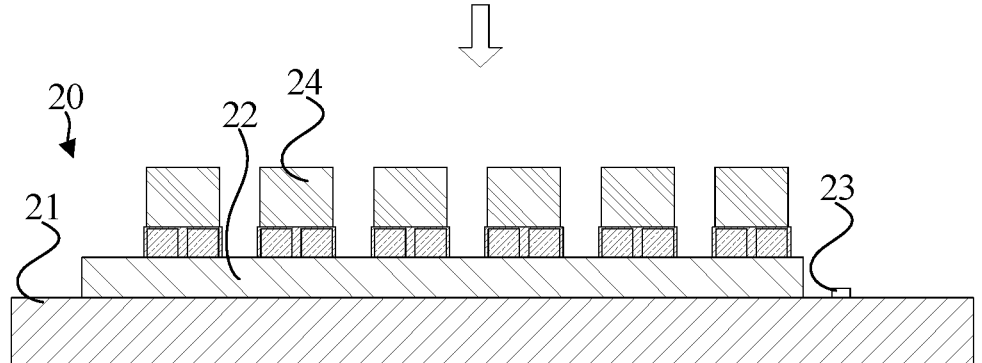
Figure 2:
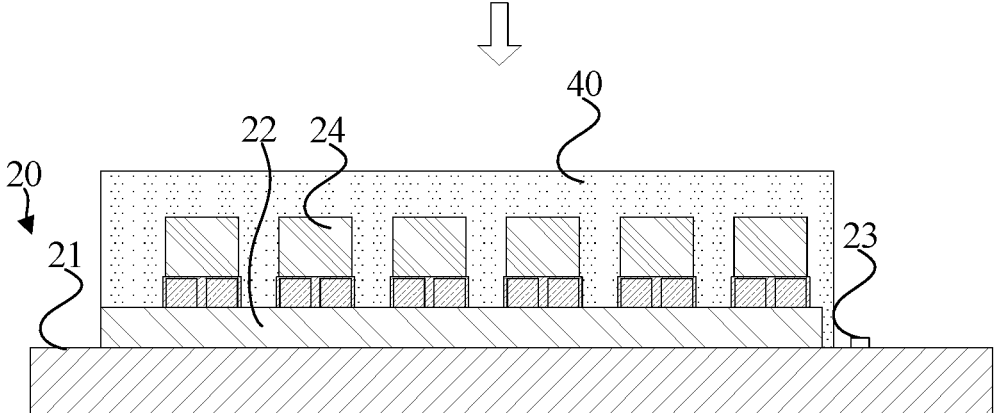
Figure 3:
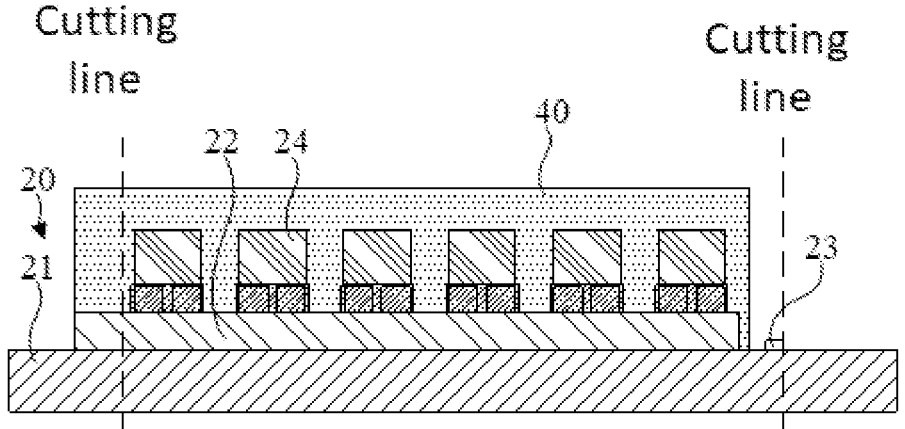
FIG. 3 is a schematic diagram of a sectional structure of performing a cutting process on the backplates and the first encapsulation layers and bonding a chip-on-film thin film on the backplates provided by one embodiment of the present application.
Figure 3:
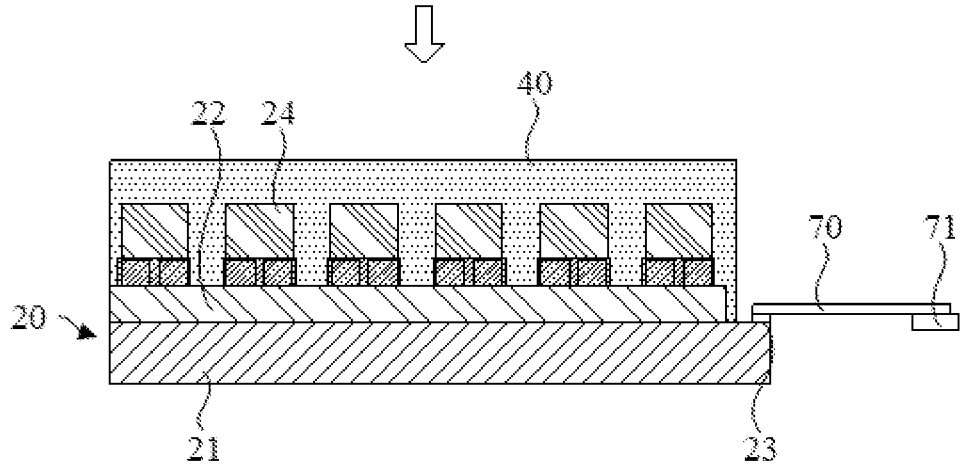
Figure 4:
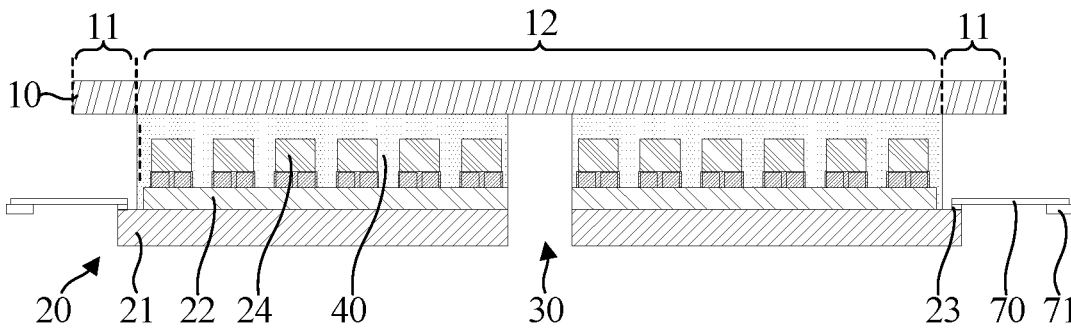
FIG. 4 is a schematic diagram of a sectional structure of providing at least two backplates on a transparent substrate provided by one embodiment of the present application.
Figure 5:
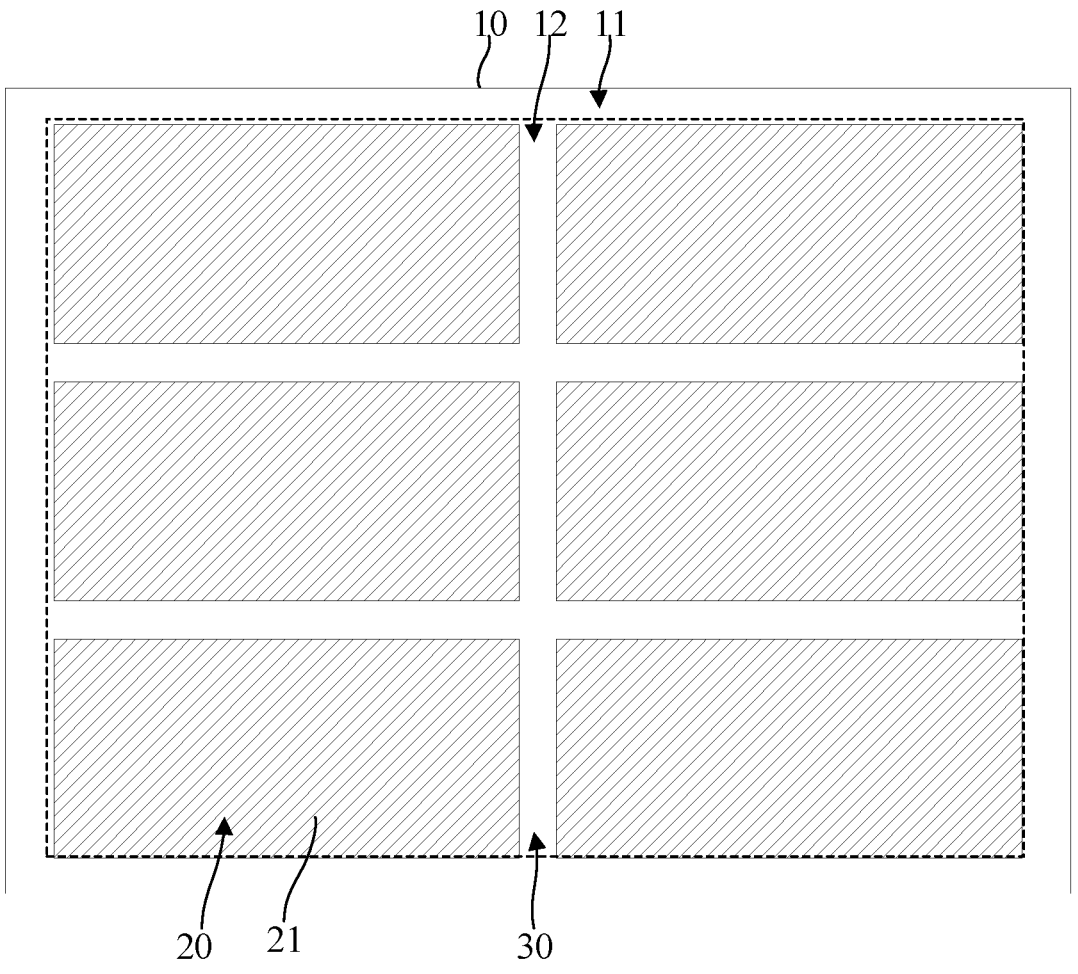
FIG. 5 is a planar structural schematic diagram of providing the at least two backplates on the transparent substrate provided by one embodiment of the present application.
Figure 6:
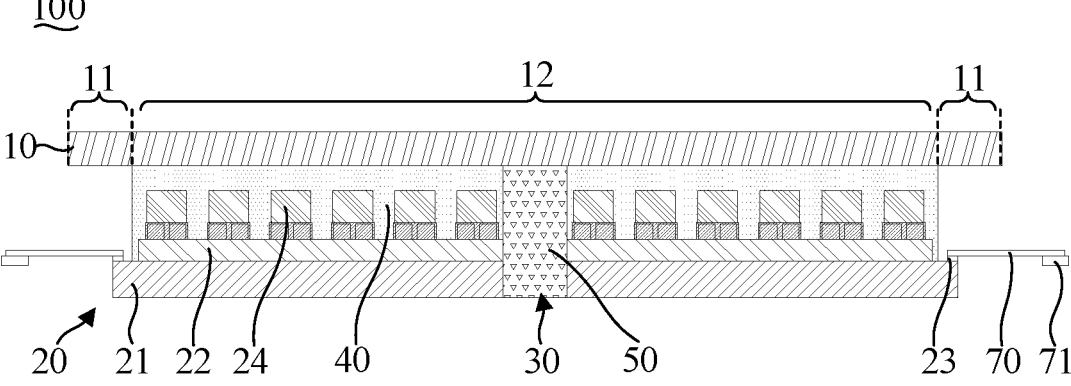
FIG. 6 is a schematic diagram of a sectional structure of forming second encapsulation layers in grooves provided by one embodiment of the present application.
Figure 7:
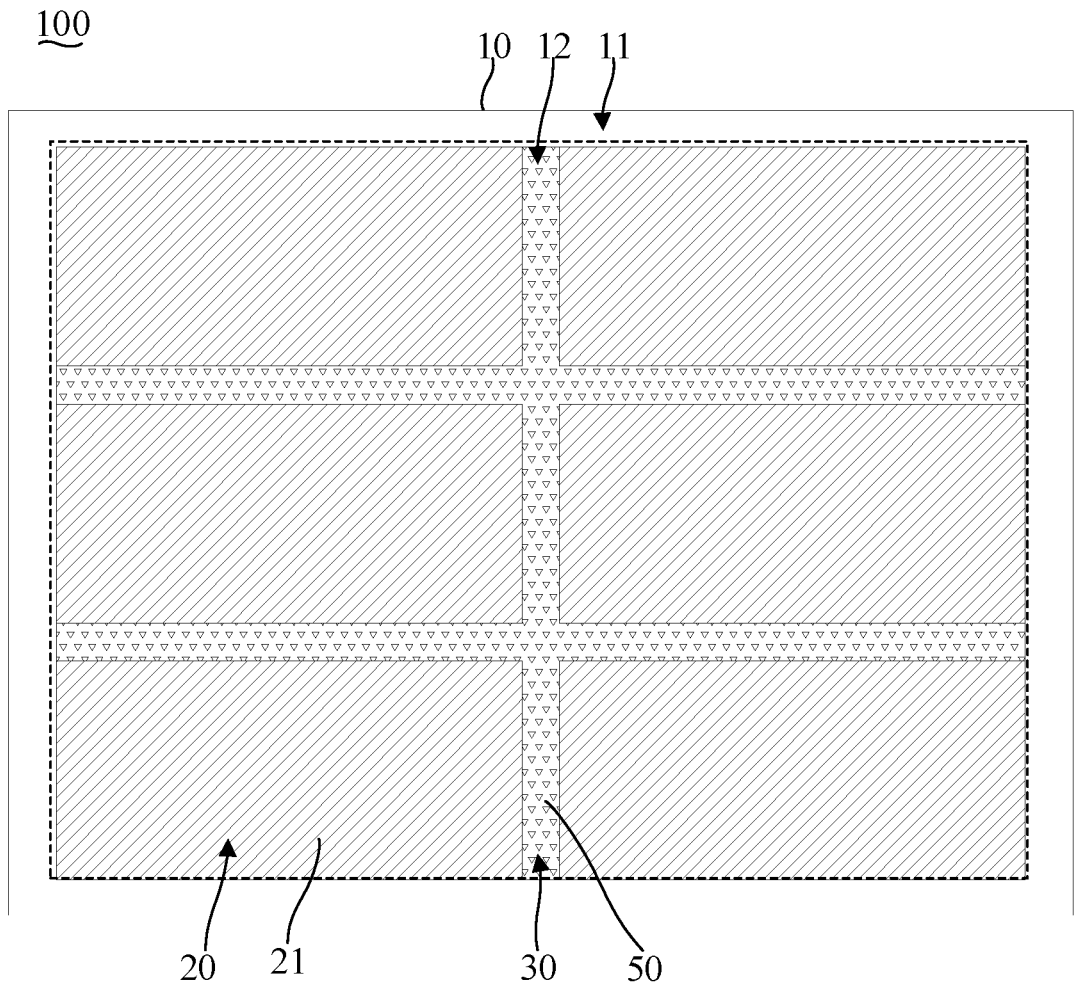
FIG. 7 is a planar structural schematic diagram of forming the second encapsulation layers in the grooves provided by one embodiment of the present application.
Figure 8:
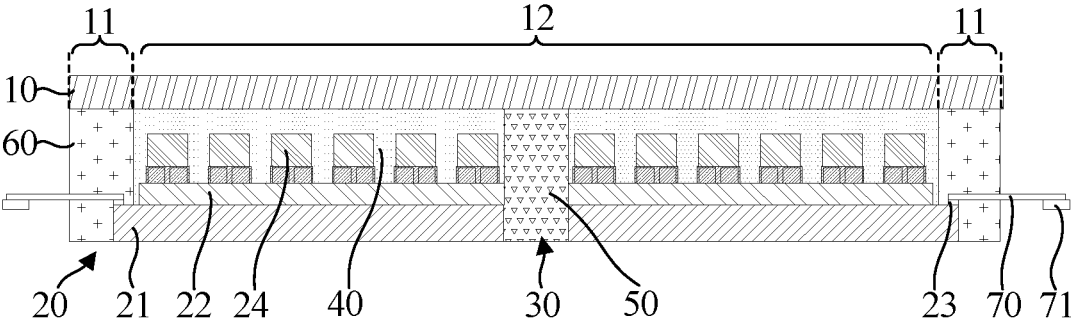
FIG. 8 is a schematic diagram of a sectional structure of forming a third encapsulation layer on a peripheral side of an encapsulation semi-finished product provided by one embodiment of the present application.
Figure 9:
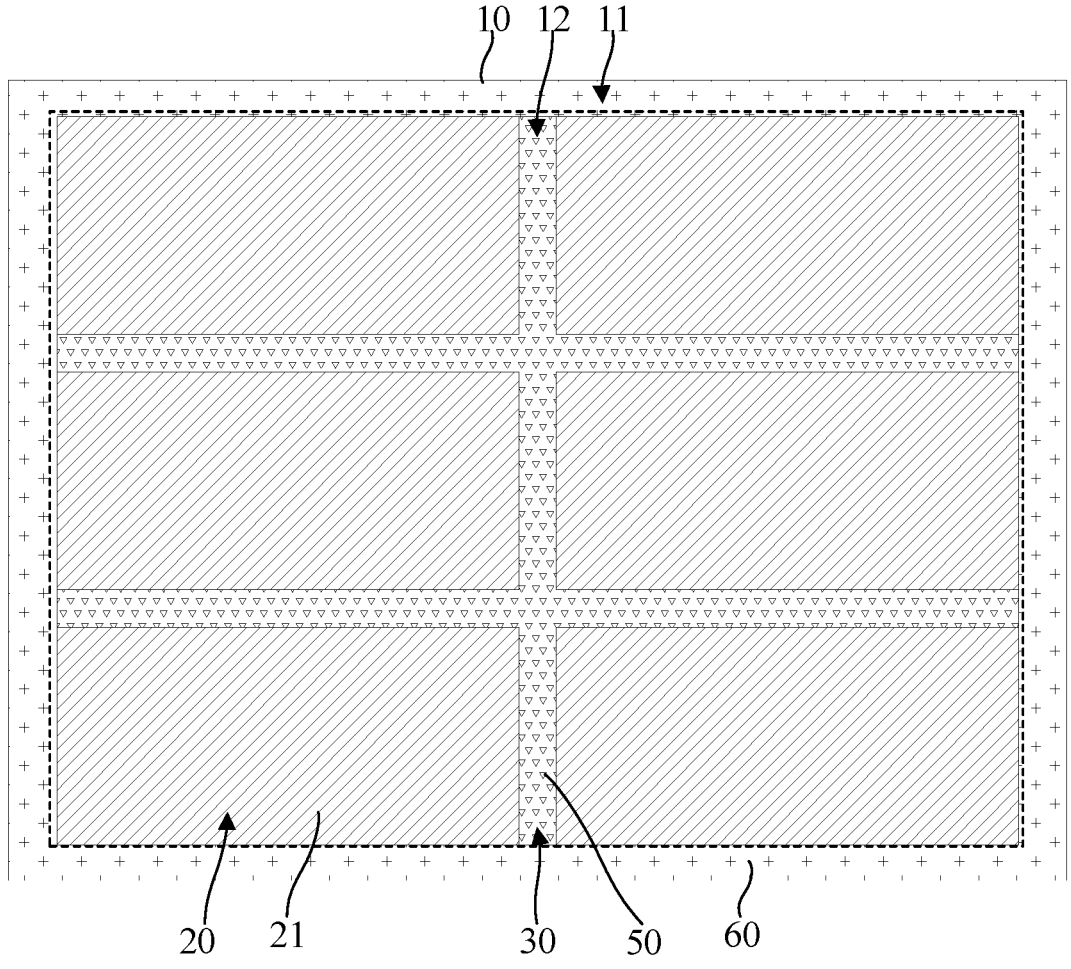
FIG. 9 is a planar structural schematic diagram of forming the third encapsulation layer on the peripheral side of the encapsulation semi-finished product provided by one embodiment of the present application.

Please refer to FIG. 1. One embodiment of the present application provides a manufacturing method of a splicing display panel, including:

step B1: as illustrated in FIG. 2, providing at least two backplates 20, wherein light-emitting devices 24 are disposed on surfaces of the backplates 20;

step B2: as illustrated in FIG. 2 and FIG. 3, forming first encapsulation layers 40 on the backplates 20, wherein the first encapsulation layers 40 cover the light-emitting devices 24;

step B3: as illustrated in FIG. 4 and FIG. 5, disposing the at two backplates 20 on a transparent substrate 10, wherein the first encapsulation layers 40 are disposed between the backplates 20 and the transparent substrate 10, and lateral surfaces of two adjacent backplates 20 and the transparent substrate 10 enclose to form grooves 30;

step B4: as illustrated in FIG. 6 and FIG. 7, forming second encapsulation layers 50 in the grooves 30 to obtain an encapsulation semi-finished product 100; and step B5: as illustrated in FIG. 8 and FIG. 9, forming a third encapsulation layer 60 on peripheral sides of the encapsulation semi-finished product 100.

In one embodiment of the present application, front surfaces of the backplates 20 are encapsulated to form first encapsulation layers 40; then, the at least two backplates 20 are fixed on the transparent substrate 10 to make grooves 30 be formed between lateral surfaces of two adjacent backplates 20 and the transparent substrate 10; next, the second encapsulation layers 50 are formed in the grooves 30 to obtain the encapsulation semi-finished product 100; and finally, the third encapsulation layer 60 is formed on the peripheral side of the encapsulation semi-finished product 100, thereby obtaining the splicing display panel. Compared to the method of coating encapsulation adhesive on the lateral surfaces of the backplates 20, the beneficial effects of the embodiments of the present application are as below.

1. The second encapsulation layer 50 can be formed by filling the grooves 30 with adhesive, which is simple to operate and is easy to implement. Furthermore, requirement on viscosity of the adhesive is low, and air bubbles are not easily generated. The second encapsulation layer 50 is formed at one time, so there is no problem of low bulk density. A water blocking performance of the second encapsulation layer is good, which can improve product reliability.

2. By adjusting the width of the grooves 30, the second encapsulation layer 50 of any width can be obtained, which is beneficial to reduce the seams of the splicing display panel.

Specifically, in the manufacturing method of the splicing display panel of one embodiment of the present application, the step B1 specifically includes:

step B11, providing a substrate 21, wherein a material of the substrate 21 can specifically be but is not limited to glass;

step B12: forming a driving circuit layer 22 and a bonding portion 23 on the substrate 21, wherein the driving circuit layer 22 is electrically connected to the bonding portion 23; and step B13, forming the light-emitting devices 24 on the driving circuit layer 22, wherein the light-emitting devices 24 can be transferred to the driving circuit layer 22 by a surface mounted technology (SMT) or a mass transferring process. Wherein, the light-emitting devices 24 can be light-emitting diodes (LEDs), specifically can be micro light-emitting diodes (micro-LEDs) or mini light-emitting diodes (mini-LEDs).

Specifically, in the aforesaid step B12, the bonding portion 23 is disposed on a side of the substrate 21. By this configuration, as illustrated in FIG. 4, when the backplates 20 are spliced, the side of the backplates 20 corresponding to the bonding portion 23 can be configured outwards, which is beneficial to reduce seams.

Specifically, in the aforesaid step B12, the driving circuit layer 22 includes a thin film transistor, and the thin film transistor includes a gate electrode, an active layer, a source electrode, and a drain electrode. The thin film transistor can be a top-gate structure. Wherein, a material of the active layer can be amorphous silicon (a-Si), indium gallium zinc oxide (IGZO), indium gallium tin oxide (IGTO), or low temperature poly-silicon (p-Si). In this embodiment, the light transmittance rate of the backplates 20 can achieve more than 80%.

Specifically, in the aforesaid step B2, the first encapsulation layers 40 can be formed by a process such as spray coating or slot die coating, and a material of the first encapsulation layers 40 can be selected from one or more than two of adhesives such as silica gel, epoxy resin adhesive, etc. By the aforesaid configuration, the first encapsulation layers 40 with a high light transmittance rate can be obtained, and the light transmittance rate of the first encapsulation layers 40 can be greater than or equal to 90%.

Specifically, in the aforesaid step B2, if a thickness of the first encapsulation layers 40 is excessive, a large light loss may appear; or if the thickness of the first encapsulation layers 40 is too thin, the encapsulation effect may be reduced, and the water vapor easily erodes the driving circuit layer 22 or the light-emitting devices 24. In order to prevent the aforesaid problems, the thickness of the first encapsulation layers 40 should be configured to be 1.2 to 2 times that of the light-emitting devices 24, which can not only reduce the light loss, but also can ensure the encapsulation effect, thereby effectively reducing the water vapor erosion.

Specifically, as illustrated in FIG. 1 to FIG. 3, after forming the first encapsulation layers 40 on the at least two backplates 20, the step B2 includes: performing a cutting process on the backplates 20 to remove process edges of the backplates 20. Under this configuration, an area of a non-display region of the backplates 20 can be reduced, which is beneficial to reduce the seams of the splicing display panel. In the cutting process, the backplates 20 and the first encapsulation layers 40 can be cut at the same time, thereby making the lateral surfaces of the backplane 20 be flat, so as to facilitate subsequent lateral encapsulation. In this embodiment, the backplates 20 can be cut by but are not limited to a laser cutting manner.

Specifically, a width of the process edges can range from 5 mm to 20 mm. For example, the width of the process edges can be 5 mm, 7 mm, 8 mm, 10 mm, 12 mm, 14 mm, 16 mm, 18 mm, or 20 mm. The width of the process edges can be adjusted appropriately according to configuration of selection for actual situations and specific requirements, and which is not limited uniquely herein.

Specifically, in the process of cutting the backplates 20, a negative tolerance of the cutting accuracy of the long edges of the corresponding backplates 20 ranges from 0 to 350 μm, and the cut and removed part is subsequently filled by the second encapsulation layers 50. This configuration can ensure the seams between the long edges of the two adjacent backplates 20 to be small during subsequent splicing.

Specifically, a negative tolerance of the cutting accuracy of the short edges of the corresponding backplates 20 ranges from 0 to 500 μm, and the cut and removed part is subsequently filled by the second encapsulation layers 50. This configuration can ensure the seams between the short edges of the two adjacent backplates 20 to be small during subsequent splicing.

It should be noted that the negative tolerance corresponding to the cutting accuracy of the short edge of the backplates 20 refers to a difference of subjecting a theoretical length of the long edge of the backplate 20 from the length of the long edge of the backplate 20 obtained after cutting, and the negative tolerance corresponding to the cutting accuracy of the long edge of the backplates 20 refers to a difference of subjecting a theoretical length of the short edge of the backplate 20 from the length of the short edge of the backplate 20 obtained after cutting.

Specifically, as illustrated in FIG. 1 to FIG. 3, after cutting the backplates 20, the step B2 further includes: bonding the chip-on-film thin film 70 to the bonding portion 23 of the backplates 20. In this embodiment, the chip-on-film thin film 70 includes a chip 71. The chip 71 is electrically connected to the driving circuit layer 22 through the bonding portion 23, so as to control the driving circuit layer 22 to work.

Specifically, in the aforesaid step B1, the backplates 20 are rectangular. Specifically, the substrate 21 is rectangular. In the aforesaid step B12, forming wirings on the substrate 21 is further included, and the bonding portion 23 is electrically connected to the driving circuit layer 22 through the wirings. In the aforesaid step B2, after the backplates 20 are cut, a distance between the long edges of the backplanes 20 and the wirings is greater than 100 μm, and this configuration can prevent accidental damage to the wiring during cutting. In this embodiment, the bonding portion 23 is disposed corresponding to the short edges of the backplates 20.

Specifically, as illustrated in FIG. 5, in the step B3, the backplates 20 are distributed in an array manner. Specifically, the backplates 20 are distributed in an array manner of N columns×M rows, wherein M and N are both positive integers, and a product of M and N is greater than or equal to 2. For example, the backplates 20 are distributed in an array manner in a form of 2 columns×M rows, where M is a positive integer. In this embodiment, the width of the grooves 30 ranges from 40 μm to 1000 μm, i.e., the distance between the two adjacent backplates 20 ranges from 40 μm to 1000 μm, and the width of the grooves 30 subsequently defined in the grooves 30 also ranges from 40 μm to 1000 μm, which is conducive to realizing seamless splicing.

Specifically, in the step B3, the width of the grooves 30 between a long edge of one backplate 20 and a long edge of an adjacent backplate ranges from 40 μm to 700 μm, and the width of the grooves 30 between a short edge of one backplate 20 and a short edge of an adjacent backplate ranges from 40 μm to 1000 μm. In this embodiment, the binding portion 23 is disposed on one of the short edges of the backplate 20.

Specifically, in one embodiment of the present application, the width of the grooves 30 defined corresponding to the long edges of the backplates 20 can be 40 μm, 50 μm, 100 μm, 150 μm, 200 μm, 250 μm, 300 μm, 350 μm, 400 μm, 450 μm, 500 μm, 550 μm, 600 μm, 650 μm, or 700 μm; and the width of the grooves 30 defined corresponding to the short edges of the backplates 20 can be 40 μm, 50 μm, 100 μm, 200 μm, 300 μm, 400 μm, 500 μm, 600 μm, 700 μm, 800 μm, 900 μm, or 1000 μm. According to configuration of selection for actual situations and specific requirements, the width of the grooves 30 corresponding to the long edges of the backplates 20 and the width of the grooves 30 corresponding to the short edges of the backplates 20 can be adjusted appropriately, which is not uniquely limited herein.

Specifically, because the bonding portion 23 is disposed on the short edge of the backplate 20, a reserved width of the short edge of the backplate 20 is relatively wide. In order to ensure the seam between two adjacent backplates 20 to be small during subsequent splicing, the negative tolerance range of the cutting accuracy of the short edges of corresponding the backplates 20 is larger than the negative tolerance range of the cutting accuracy of the long edges of the corresponding backplates 20. Because the short edges of the backplates 20 shrinks more, the width of the grooves 30 disposed corresponding to the short edges is made to be larger than the width of the grooves 30 disposed corresponding to the long edges. Therefore, the width of the second encapsulation layers 50 on the short edges of the backplates 20 should be larger than the width of the second encapsulation layer 50 on the long edges, which is beneficial to prevent water vapor from entering the interior of the backplates 20 from the short edges of the backplates 20.

Specifically, in one embodiment of the present application, a material of the transparent substrate 10 can be glass or tempered glass, making the light transmittance rate of the transparent substrate 10 be greater than or equal to 90%. Of course, according to configuration of selection for actual situations and specific requirements, a material of the transparent substrate 10 can also be a polyethylene terephthalate (PET) film or other transparent films, which only needs to ensure the light transmittance rate of the transparent substrate 10 to be greater than or equal to 90%, and is not uniquely limited herein.

Specifically, in the aforesaid step B4, the adhesive can be filled into the grooves 30 by a filling manner, so the adhesive is made to be flush with a surface of a side of the backplates 20 facing away from the transparent substrate 10. Then, a cure process is performed on the adhesive, thereby obtaining the second encapsulation layers 50. In this embodiment, specifically, the adhesive can be filled into the grooves 30 by dispensing, spraying, or dipping.

Specifically, in the aforesaid step B4, a material of the adhesive can be selected from one or two of epoxy resin or acrylic resin, etc. The manufactured second encapsulation layers 50 have a low water vapor transmission rate (WVIR), and the water vapor transmission rate of the second encapsulation layer 50 is less than or equal to $10^{-3}$ g/m²/day. Through the aforesaid configuration, side encapsulation effect of the backplates 20 can be greatly improved. In this embodiment, the light transmittance rate of the second encapsulation layers 50 can be greater than or equal to 90%, which is beneficial to eliminate the seams.

Specifically, in the step B3, as illustrated in FIG. 5, the transparent substrate 10 includes a first region 11 and a second region 12. The first region 11 is configured to enclose the second region 12, and the backplates 20 and the grooves 30 are disposed corresponding to the second region 12, i.e., edges of the transparent substrate 10 extends beyond outer edges of the backplates 20. Under this configuration, combined with FIG. 9, in the step B5, during the process of forming the third encapsulation layer 60, because the first region 11 of the transparent substrate 10 extends to the outer edges of the backplates 20, the first region 11 of the transparent substrate 10 can serve an auxiliary and blocking effects, which prevents the adhesive from overflowing to an light-exiting side of the backplates 20 during the process of coating and forming the third encapsulation layer 60. Therefore, a situation of the third encapsulation layer 60 affecting light output is prevented, thereby making the formed third encapsulation layer 60 to be disposed corresponding to the first region 11.

Specifically, in the step B3, a width of the first region 11 can range from 0.2 mm to 1 mm. For example, the width of the first region 11 can be 0.2 mm, 0.3 mm, 0.4 mm, 0.5 mm, 0.6 mm, 0.7 mm, 0.8 mm, 0.9 mm, or 1 mm. Under this configuration, the first region 11 of the transparent substrate 10 serving the auxiliary and blocking effects can be ensured, which prevents the adhesive from overflowing to the light-exiting side of the backplates 20 during the process of coating and forming the third encapsulation layer 60. Therefore, the situation of the third encapsulation layer 60 affecting light output is prevented.

Specifically, the light transmittance rate of the first encapsulation layers 40 is greater than a light transmittance rate of the third encapsulation layer 60, and a light transmittance rate of the second encapsulation layers 50 is greater than the light transmittance rate of the third encapsulation layer 60. Under this configuration, light leakage of the splicing display panel can be prevented. In this embodiment, a material of the third encapsulation layer 60 can be black adhesive.

Please refer to FIG. 8 and FIG. 9. One embodiment of the present application further provides a splicing display panel, including a transparent substrate 10, at least two backplates 20, first encapsulation layers 40, second encapsulation layers 50, and a third encapsulation layer 60. The backplates 20 are disposed on a side of the transparent substrate 10. The light-emitting devices 24 are disposed on surfaces of the backplates 20 close to the transparent substrate 10. Lateral surfaces of two adjacent backplates 20 and the transparent substrate 10 enclose to form grooves 30. The first encapsulation layers 40 are disposed between the transparent substrate 10 and the backplates 20. The first encapsulation layers 40 cover the light-emitting devices 24. The second encapsulation layers 50 are disposed in the grooves 30. The third encapsulation layer 60 is disposed on peripheral sides of the aforesaid at least two backplates 20, i.e., the third encapsulation layer 60 is disposed to enclose the at least two backplates 20 and the second encapsulation layers 50.

Specifically, the backplate 20 further includes a substrate 21, a driving circuit 22, and a bonding portion 23. A material of the substrate 21 can specifically be but is not limited to glass. The driving circuit layer 22 and the bonding portion 23 are disposed on the substrate 21. The driving circuit layer 22 is electrically connected to the bonding portion 23. The light-emitting devices 24 are disposed on the driving circuit layer 22. In this embodiment, the light-emitting devices 24 can be light-emitting diodes (LEDs), specifically can be micro light-emitting diodes (micro-LEDs) or mini light-emitting diodes (mini-LEDs).

Specifically, the bonding portion 23 is disposed on a side of the substrate 21. By this configuration, when the backplates 20 are spliced, the side of the backplates 20 corresponding to the bonding portion 23 can be configured outwards, which is beneficial to reduce seams.

Specifically, the driving circuit layer 22 includes a thin film transistor. The thin film transistor 20 includes a gate electrode, an active layer, a source electrode, and a drain electrode. The thin film transistor can be a top-gate structure. Wherein, a material of the active layer can be amorphous silicon (a-Si), indium gallium zinc oxide (IGZO), indium gallium tin oxide (IGTO), or low temperature poly-silicon (p-Si). In this embodiment, the light transmittance rate of the backplates 20 can achieve more than 80%.

Specifically, a material of the first encapsulation layers 40 can be selected from one or more than two of adhesives such as silica gel, epoxy resin adhesive, etc. By the aforesaid configuration, the first encapsulation layers 40 with a high light transmittance rate can be obtained, and the light transmittance rate of the first encapsulation layers 40 can be greater than or equal to 90%.

Specifically, if a thickness of the first encapsulation layers 40 is excessive, a large light loss may appear; or if the thickness of the first encapsulation layers 40 is too thin, the encapsulation effect may be reduced, and the water vapor easily erodes the driving circuit layer 22 or the light-emitting devices 24. In order to prevent the aforesaid problems, the thickness of the first encapsulation layers 40 should be configured to be 1.2 to 2 times that of the light-emitting devices 24, which can not only reduce the light loss, but also can ensure the encapsulation effect, thereby effectively reducing the water vapor erosion.

Specifically, the splicing display panel further includes a chip-on-film thin film 70. The chip-on-film thin film 70 is bonded to the bonding portion 23. In this embodiment, the chip-on-film thin film 70 includes a chip 71. The chip 71 is electrically connected to the driving circuit layer 22 through the bonding portion 23, so as to control the driving circuit layer 22 to work.

Specifically, the backplates 20 are rectangular. Specifically, the substrate 21 is rectangular. The backplate 20 further includes wiring disposed on the substrate 21, and the bonding portion 23 is electrically connected to the driving circuit layer 22 through the wirings. In this embodiment, the bonding portion 23 is disposed corresponding to the short edges of the backplates 20.

Specifically, the backplates 20 are distributed in an array manner. Specifically, the backplates 20 are distributed in the array manner of N columns×M rows, wherein M and N are both positive integers, and a product of M and N is greater than or equal to 2. For example, the backplates 20 are distributed in an array manner in a form of 2 columns×M rows, where M is a positive integer. In this embodiment, the width of the second encapsulation layer 50 between two adjacent backplates 20 ranges from 40 μm to 1000 μm, which is conducive to realizing seamless splicing.

Specifically, a width of the second encapsulation layer 50 between a long edge of the backplate 20 and a long edge of the adjacent backplate 20 ranges from 40 μm to 700 μm, and a width of the second encapsulation layer 50 between a short edge of the backplate 20 and a short edge of the adjacent backplate 20 ranges from 40 μm to 1000 μm.

Specifically, in one embodiment of the present application, the width the second encapsulation layer 50 between the long edge of one backplate 20 and the long edge of an adjacent backplate 20 can be 40 μm, 50 μm, 100 μm, 150 μm, 200 μm, 250 μm, 300 μm, 350 μm, 400 μm, 450 μm, 500 μm, 550 μm, 600 μm, 650 μm, or 700 μm; and the width the second encapsulation layer 50 between the short edge of one backplate 20 and the short edge of an adjacent backplate 20 can be 40 μm, 50 μm, 100 μm, 200 μm, 300 μm, 400 μm, 500 μm, 600 μm, 700 μm, 800 μm, 900 μm, or 1000 μm.

According to configuration of selection for actual situations and specific requirements, the width the second encapsulation layer 50 between the long edge of the backplate 20 and the long edge of the adjacent backplate 20 and the width the second encapsulation layer 50 between the short edge of the backplate 20 and the short edge of the adjacent backplate 20 can be adjusted appropriately, which is not uniquely limited herein.

Specifically, the binding portion 23 is disposed on one of the short edges of the backplate 20. In order to prevent water vapor from intruding into the backplates 20 from the bonding portion 23 on the short edges of the back plate 20, the width of the second encapsulation layers 50 between the short edge of the backplate 20 and the short edge of the adjacent backplate 20 can be made to be greater than the width the second encapsulation layer 50 between the long edge of the backplate 20 and the long edge of the adjacent backplate 20.

Specifically, in one embodiment of the present application, a material of the transparent substrate 10 can be glass or tempered glass, making the light transmittance rate of the transparent substrate 10 be greater than or equal to 90%. Of course, according to configuration of selection for actual situations and specific requirements, a material of the transparent substrate 10 can also be a polyethylene terephthalate (PET) film or other transparent films, which only needs to ensure the light transmittance rate of the transparent substrate 10 to be greater than or equal to 90%, and is not uniquely limited herein.

Specifically, in the aforesaid step B4, a material of the second encapsulation layers 50 can be selected from one or two of epoxy resin or acrylic resin, etc. The manufactured second encapsulation layers 50 have a low water vapor transmission rate (WVTR), and the water vapor transmission rate of the second encapsulation layer 50 is less than or equal to $10^{-3}$ g/m²/day. Through the aforesaid configuration, side encapsulation effect of the backplates 20 can be greatly improved. In this embodiment, the light transmittance rate of the second encapsulation layers 50 can be greater than or equal to 90%, which is beneficial to eliminate the seams.

Specifically, the transparent substrate 10 includes a first region 11 and a second region 12. The first region 11 is configured to enclose the second region 12, and the backplates 20 and the grooves 30 are disposed corresponding to the second region 12, i.e., edges of the transparent substrate 10 extends beyond outer edges of the backplates 20. Under this configuration, during the process of forming the third encapsulation layer 60, because the first region 11 of the transparent substrate 10 extends to the outer edges of the backplates 20, the first region 11 of the transparent substrate 10 can serve an auxiliary and blocking effects, which prevents the adhesive from overflowing to an light-exiting side of the backplates 20 during the process of coating and forming the third encapsulation layer 60. Therefore, a situation of the third encapsulation layer 60 affecting light output is prevented, thereby making the formed third encapsulation layer 60 to be disposed corresponding to the first region 11.

Specifically, a width of the first region 11 can range from 0.2 mm to 1 mm. For example, the width of the first region 11 can be 0.2 mm, 0.3 mm, 0.4 mm, 0.5 mm, 0.6 mm, 0.7 mm, 0.8 mm, 0.9 mm, or 1 mm. Under this configuration, the first region 11 of the transparent substrate 10 serving the auxiliary and blocking effects can be ensured, which prevents the adhesive from overflowing to the light-exiting side of the backplates 20 during the process of coating and forming the third encapsulation layer 60. Therefore, the situation of the third encapsulation layer 60 affecting light output is prevented.

Specifically, a width of the first region 11 can range from 0.2 mm to 1 mm. For example, the width of the first region 11 can be 0.2 mm, 0.3 mm, 0.4 mm, 0.5 mm, 0.6 mm, 0.7 mm, 0.8 mm, 0.9 mm, or 1 mm.

Specifically, the light transmittance rate of the first encapsulation layers 40 is greater than a light transmittance rate of the third encapsulation layer 60, and a light transmittance rate of the second encapsulation layers 50 is greater than the light transmittance rate of the third encapsulation layer 60. Under this configuration, light leakage of the splicing display panel can be prevented. In this embodiment, a material of the third encapsulation layer 60 can be black adhesive.

The manufacturing method of the splicing display panel and the splicing display panel provided by the embodiments of the present application are described in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present disclosure. In summary, the content of the specification should not be understood as limit to the present application.

What is claimed is:

1. A manufacturing method of a splicing display panel, comprising:

step B1: providing at least two backplates, wherein light-emitting devices are disposed on surfaces of the at least two backplates;

step B2: forming first encapsulation layers on the at least two backplates, wherein the first encapsulation layers cover the light-emitting devices;

step B3: disposing the at least two backplates on a transparent substrate, wherein the first encapsulation layers are disposed between the at least two backplates and the transparent substrate, and lateral surfaces of two adjacent backplates and the transparent substrate enclose to form grooves, wherein the transparent substrate comprises a first region and a second region, the first region is configured to enclose the second region, and the at least two backplates and the grooves are disposed corresponding to the second region;

step B4: forming second encapsulation layers in the grooves to obtain an encapsulation semi-finished product; and step B5: forming a third encapsulation layer on peripheral sides of the encapsulation semi-finished product, wherein the third encapsulation layer is disposed only corresponding to the first region.

2. The manufacturing method of the splicing display panel as claimed in claim 1, wherein in the step B3, the at least two backplates are distributed in an array manner, and a width of the grooves ranges from 40 μm to 1000 μm.

3. The manufacturing method of the splicing display panel as claimed in claim 2, wherein after forming the first encapsulation layers on the at least two backplates, the step B2 comprises: performing a cutting process on the at least two backplates to remove process edges of the at least two backplates.

4. The manufacturing method of the splicing display panel as claimed in claim 3, wherein in the step B1, the at least two backplates are rectangular;

in the step B3, the width of the grooves between a long edge of one of the at least two backplates and a long edge of adjacent one of the at least two backplates ranges from 40 μm to 700 μm, and the width of the grooves between a short edge of one of the at least two backplates and a short edge of adjacent one of the at least two backplates ranges from 40 μm to 1000 μm.

5. The manufacturing method of the splicing display panel as claimed in claim 1, wherein a width of the first region ranges from 0.2 mm to 1 mm.

6. The manufacturing method of the splicing display panel as claimed in claim 1, wherein a light transmittance rate of the first encapsulation layers is greater than a light transmittance rate of the third encapsulation layer, and a light transmittance rate of the second encapsulation layers is greater than the light transmittance rate of the third encapsulation layer.

7. The manufacturing method of the splicing display panel as claimed in claim 1, wherein in the step B2, a thickness of the first encapsulation layers is 1.2 to 2 times of a thickness of the light-emitting devices.

8. The manufacturing method of the splicing display panel as claimed in claim 1, wherein in the step B1, the at least two backplates are rectangular, and a bonding portion is disposed on a short edge of the at least two backplates; and the step B2 comprises bonding a chip-on-film thin film to the bonding portion of the at least two backplates.

9. The manufacturing method of the splicing display panel as claimed in claim 1, wherein in the step B4, an adhesive is filled into the grooves, a material of the adhesive is selected from one or two of epoxy resin or acrylic resin; and then, a cure process is performed on the adhesive, thereby obtaining the second encapsulation layers.

\* \* \* \* \*